United States Patent
Usoskin et al.

(10) Patent No.: US 6,506,439 B1
(45) Date of Patent: Jan. 14, 2003

(54) APPARATUS AND PROCESS FOR THE PRODUCTION OF A SUPERCONDUCTIVE LAYER

(75) Inventors: Alexander Usoskin, Goettingen (DE); Herbert Carl Freyhardt, Goettingen (DE); Juergen Knoke, Langelsheim (DE)

(73) Assignee: Zentrum für Funktionswerkstoffe Gemeinnuetzige Gesellschaft mbH, Goettingen (DE)

(*) Notice: Subject to any disclaimer, the term of this patent is extended or adjusted under 35 U.S.C. 154(b) by 49 days.

(21) Appl. No.: 09/721,303

(22) Filed: Nov. 22, 2000

(30) Foreign Application Priority Data

Nov. 26, 1999 (DE) .......................... 199 57 097
Sep. 12, 2000 (DE) .......................... 100 45 065

(51) Int. Cl.[7] .......................... B05D 5/12; H07L 39/24; C23C 14/00
(52) U.S. Cl. .......................... 427/62; 427/586; 427/596; 29/599; 505/204; 505/477; 204/192.15; 204/192.24
(58) Field of Search .......................... 505/100, 410, 505/412, 434, 474, 475, 477, 511, 204; 427/62, 586, 596; 29/599; 204/192.15, 192.24

(56) References Cited

U.S. PATENT DOCUMENTS 5,426,092 A * 6/1995 Ovshinsky et al. ......... 505/461
5,736,464 A    4/1998 Opower
5,846,911 A * 12/1998 Freyhardt et al. .......... 505/434

FOREIGN PATENT DOCUMENTS

| DE | 42 28 573 C1 | 2/1994 |
| DE | 42 29 399 A1 | 3/1994 |
| DE | 197 27 343 A1 | 1/1998 |
| EP | 0 398 375 A2 | 11/1990 |
| EP | 0 469 603 A2 | 2/1992 |
| EP | 469603 A2 * | 5/1992 |
| EP | 0 702 416 A1 | 3/1996 |
| EP | 702426 A1 * | 3/1996 |
| JP | 70144 * | 3/1996 |
| JP | 85865 * | 4/1996 |

* cited by examiner

Primary Examiner—Brian K. Talbot
(74) Attorney, Agent, or Firm—Husch & Eppenberger, LLC; Robert E. Muir

(57) ABSTRACT

An apparatus and process for applying a superconductive layer on an elongate substrate that includes moving the elongate substrate through a heating zone, applying a pulsed laser beam against a target, having a length, that is coated with superconductive material wherein particles of superconductive material are separated from the target and strike the elongate substrate with a plasma beam in the heating zone, and oscillating the pulsed laser beam across the target to provide a substantially uniform coating of superconductive material on the elongate substrate.

32 Claims, 2 Drawing Sheets

APPARATUS AND PROCESS FOR THE PRODUCTION OF A SUPERCONDUCTIVE LAYER

FIELD OF THE INVENTION

This invention involves an apparatus and process for applying a superconductive layer on an elongate substrate in a heating zone.

BACKGROUND OF THE INVENTION

The effects of superconductivity have been known for a long time. The presence of a superconductor virtually negates the presence of resistance, below a certain critical temperature, thereby allowing direct current to flow unhindered by power losses. The critical temperature is 18.2 degrees Kelvin, for example, for the material $Nb_{3Sn}$ where helium is used as the cooling agent. When electric current passes through a superconductor, there is virtually no power loss. However, a significant problem is the creation and maintenance of the very low critical temperatures required by typical superconductors.

An alternative is the use of high temperature superconducting materials "HTSL", which have a critical temperature of over 11 degrees Kelvin. These high temperature superconducting material "HTSL" materials can include such components as Yttruim, Barium, copper and oxygen. The high temperature superconducting material "HTSL" materials can be applied to a substrate, for example, by means of a pulsed laser beam, plasma evaporation, thermal evaporation or chemical treatment with heating of the substrate.

One procedure is described in DE 42 28 573 C1, where high temperature superconducting "HTSL" sections of good quality can be produced on a repetitive basis. The coating is intermittently struck with a pulsed laser beam. This results in a homogenous application of temperature for the substrate and the sections of the coating that have been struck by the intermittent laser pulse. A significant problem with this approach is that the current load-carrying capacity of the superconductive layer on the substrate is small and this process is only feasible due to the low separation rate with a low speed of application.

A number of attempts have been made to increase of the current load-carrying capacity of the produced high temperature superconducting "HTSL" section, such as that described in DE 197 27 343 A1, where a method of producing a high-temperature superconductive coating on an elongated substrate is disclosed. The method includes the steps of drawing the elongated substrate through a deposition chamber, heating the elongated substrate in a heating zone in the deposition chamber, coating the elongated substrate with high-temperature superconducting material in the heating zone to produce a superconductive elongated substrate, the superconductive coated elongated substrate having a first non-flat geometric form during the coating step, cooling down the substrate with the superconducting coating, and bending the superconductive coated elongated substrate into a second geometric form, which differs from the first geometric form, thereby producing a compressive strain in the superconductive coating and a capacity to carry higher current in the coating of the second geometric form than in the coating of the first geometric form, while retaining superconductivity.

With this procedure, the superconducting material is first applied to the substrate in one geometric form and then bent into a second geometric form after cooling. This will substantially increase the current load-carrying capacity of the high temperature superconducting material "HTSL". However, this is a very slow procedure with a maximum coating rate of 10 millimeters×centimers$^2$/second. When you increase the rate of applying the laser pulses, the performance parameters associated with the high temperature superconducting material "HTSL" will denigrate.

Another procedure is disclosed in EP 0 469 603 A2, where a first mirror deflects the laser beam in one direction and a second mirror deflects the laser beam in another direction perpendicular thereto to perform two dimensional scanning of the target. The two mirrors can be adjusted by electromagnetic drives in such a way that the laser beam can strike the entire target reducing the comsumption of superconductive material on the surface of the target. This procedure is very complex and the coordination of the two mirrors is fraught with trouble.

The present invention is directed to overcoming one or more of the problems set forth above.

SUMMARY OF THE INVENTION

In one aspect of this invention, a process for applying a superconductive layer on an elongate substrate is disclosed. The process includes moving the elongate substrate through a heating zone, applying a pulsed laser beam against a target, having a length, that is coated with superconductive material wherein particles of superconductive material are separated from the target and strike the elongate substrate with a plasma beam in the heating zone, and oscillating the pulsed laser beam across the target to provide a substantially uniform coating of superconductive material on the elongate substrate.

In another aspect of this invention, an apparatus for applying a superconductive layer on an elongate substrate is disclosed. The apparatus includes a deposition chamber having a heating zone through which an elongate substrate can be moved, a laser that can apply a pulsed laser beam, a target, having a length, that is coated with superconductive material, and an oscillating mechanism to move the pulsed laser beam across the target, wherein particles of superconductive material can be separated from the target and strike the elongate substrate with a plasma beam in the heating zone to provide a substantially uniform coating of superconductive material on the elongate substrate.

Still another aspect of this invention, the oscillating of the pulsed laser beam across the target includes directing the pulsed laser beam to a laser beam deflector that can reflect the pulsed laser beam across the length of the target.

Yet another aspect of this invention, further includes rotating the target at least one hundred and eighty degrees.

The above aspects are merely illustrative examples of an infinite number of aspects associated with this invention and should by no means be deemed limiting in any manner whatsoever.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION

Figure 1:
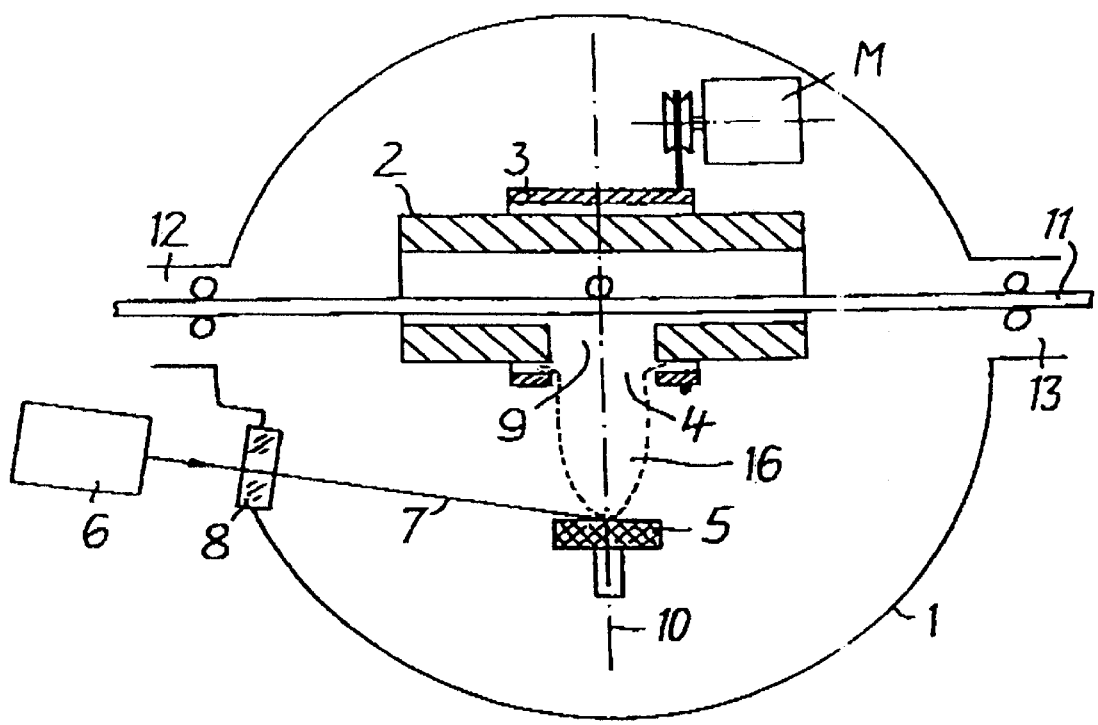
FIG. 1 is a schematic representation a device for the execution of the procedure of the present invention.

Referring now to the drawings, and initially to FIG. 1, a deposition chamber is generally indicated by numeral 1. Deposition chamber 1, for example, is where a vacuum is produced and maintained. A nonlimiting example would include holding the pressure to 0.5 milibars in an oxygen atmosphere.

In deposition chamber 1, there is preferably a tubular heating zone 2 with a surrounding screen 3 that encircles the tubular heating zone 2 with the exception of an opening 4. An electrical motor M is in contact with the surrounding screen 3 in order to rotate the surrounding screen 3 around the axis of the surrounding screen 3.

The basic superconductive material forms a target 5 in front of the surrounding screen 3. A laser beam 7 that is created from a pulsed laser 6 enters the deposition chamber 1 through a window 8. The laser beam 7 is directed against and meets the target 5. There is an opening 9 in the tubular heating zone 2 which is entirely blocked by the rotating surrounding screen 3 with the sole exception of when the opening 4 in the surrounding screen 3 is directly in front of the opening 9. This will allow the laser beam 7 to enter the opening 9 of the tubular heating zone 2 on an intermittent basis. The target 5 is preferably symmetrically aligned with a line 10 having a distance to the tubular heating zone 2 and positioned in the center of the opening 9.

The substrate 11, according to the preferred embodiment of the present invention, enters the deposition chamber 1 through a first opening 12 in the deposition chamber 1, passes through the tubular heating zone 2 and then leaves the deposition chamber 1 through a second opening 13.

The substrate 11, preferably in the form of rolls, can be moved into the first opening 12, second opening 13 of the deposition chamber 1 as well as the tubular heating zone 2.

Figure 2:
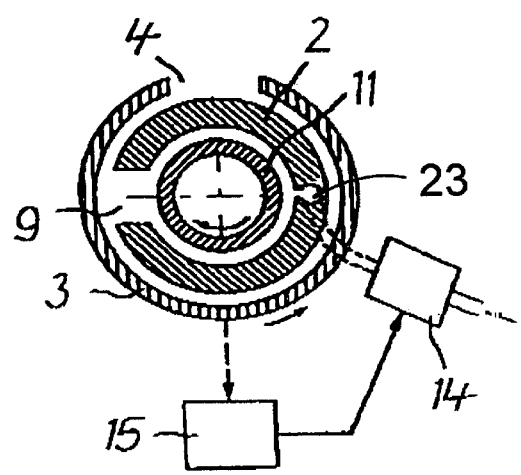
FIG. 2 is a sectional view of portion of the device according to FIG. 1.

There are two control units 14 and 15, respectively, as shown in FIG. 2, which control the laser beam 7 and provides synchronization of the surrounding screen 3.

In order to execute the procedure of the present invention, according to FIG. 1, first the laser 6 and the tubular heating zone 2 need to be activated. The laser beam 7 then hits the target 5 and loosens particles of superconductive material. These separated particles of superconductive material hit the substrate 11 through the plasma beam 16 that is indicated by dashed lines. The substrate 11 located in the tubular heating zone 2 is thereby coated with superconductive material.

Another preferred aspect of the present invention is a procedure that allows the laser beam 7 to shift so that a level coating of superconductive material can be applied to the substrate 11. In this manner, the laser beam 7 is shifted and oscillated in such a manner that the coating on the substrate 11 is applied in an even and continuous manner. In addition, a laser beam deflector 17, that is preferably, but not necessarily, in the form of a mirror can be pivoted and swung along an adjustable angle indicated by the double arrow 18 shown in FIG. 3. The laser beam 7 can be diverted through the level of oscillation in such a manner that the laser beam 7 can cover the entire length L of the target 5, as shown in FIG. 4 and is also shown by the dotted lines in FIG. 3.

The laser beam deflector, e.g., mirror 17 can be moved back and forth on a uniform and homogeneously rate of speed. However, it can be controlled in response to a symmetrical or asymmetrical saw tooth curve, so that the laser beam 7 swings in accordance with the pulse of this saw tooth curve or waveform.

The target 5, preferably but not necessarily, is arranged so that the surface of the target 5 with the largest dimension is in the same direction as the substrate 11 as the substrate 11 and moves through the tubular heating zone 2 and is parallel thereto as indicated by arrow 19. During the coating procedure, the target 5 is shifted periodically toward the arrow 20, as shown in FIG. 4, which is transverse and optimally at a right angle to the level where the laser beam 7 swings. The shift is affected whenever the laser beam 7 covers at least the entire length L of the target 5. In this way, the entire basic surface of the target 5 is gradually covered by superconductive material by the laser beam 7 oscillating or swinging in a continuous and uniform manner.

Figure 4:
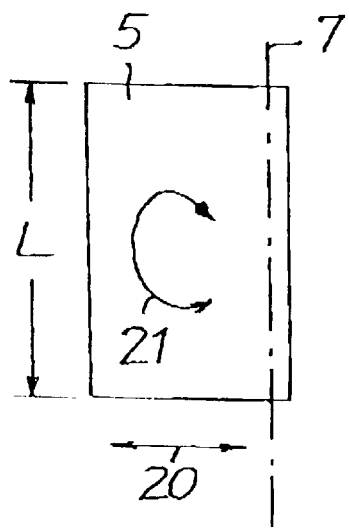
FIG. 4 is a plan view of superconductive material for a basic target that is usable with the procedure of the present invention.

During the coating procedure it is suggested to rotate the target 5 around one hundred and eighty degrees (180°), as shown in FIG. 4, by the arrow indicated by numeral 21. With this approach, the superconductive material existing on the target 5 can be better utilized and stabilized. This is in addition to the uniform application of the coating rate. It is preferred that this one-hundred and eighty degree (180°) rotation of the target 5 occur when the laser beam 7 covers the entire length L of the target 5 and there have been ten (10) passes of the laser beam 7. When the target 5 is rotated one hundred and eighty degrees (180°), the laser beam 7 and the laser beam deflector 17 are briefly interrupted.

The opening 9 of the tubular heating zone 2 as well as the opening 4 in the surrounding screen 3 are adapted to the dimensions of the target 5 with regard to their axial length. When the pulsed laser beam 7 hits the surface of the target 5 then superconductive particles are extracted from the surface of the target 5 and separated by plasma beams 16 onto the surface of the substrate 11.

Figure 3:
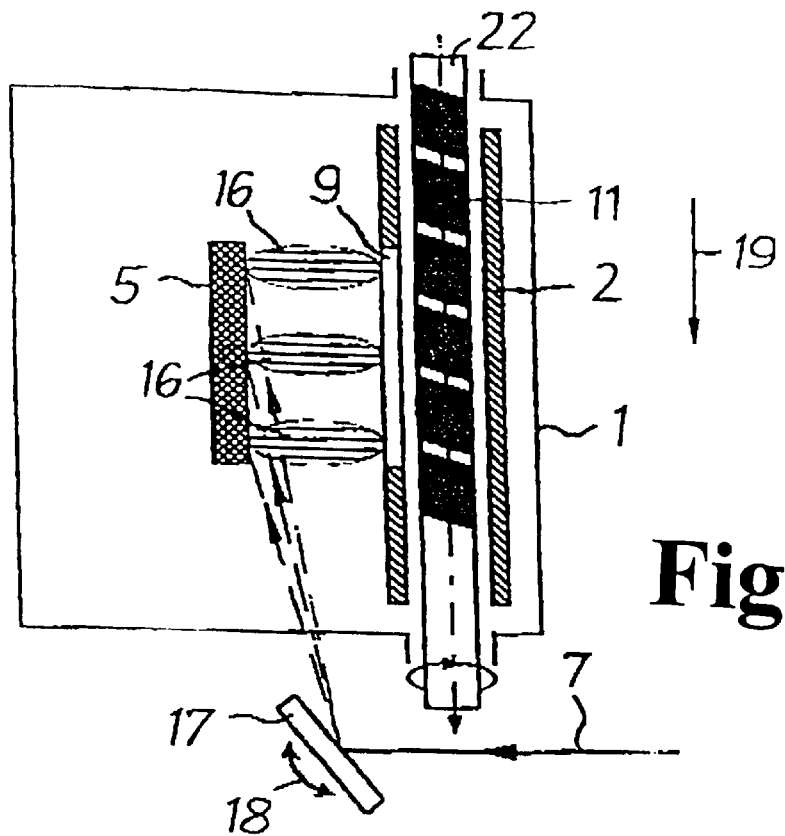
FIG. 3 is a magnified detailed view taken from FIG. 1.

In FIG. 3, there are three (3) plasma beams 16 illustrated. A substantially larger surface of the substrate 11 can be coated, during this time, in a continuous manner with superconductive material. The substrate 11 can be material that is helically wound around a pipe 22, as shown in FIG. 3, which can be turned during the coating procedure around its axle and/or moved linear direction. The rate of coating can be increased in this manner.

In order to provide uniform coverage of the target 5, the laser beam 7 preferably oscillates with a frequency F1 according to the following equation:

$$F1 = K \times F/(L/A),$$

wherein K is a coefficient between the values of 0.5 and 8.0, F is the repetition rate of laser pulses in cycles per second, L, as previously described, is the length of the target 5, in millimeters, over which the laser beam 7 oscillates, and A is a constant that corresponds to one (1) millimeter.

The empirically determined coefficient K determines the temporal distance, with which the superconductive particles are loosened by the laser beam 7 from the target 5. If K is smaller than 0.5, overlapping can result. Therefore, the superconductive particles should have at least partial separation on the same location of the substrate 11. On the other hand, a value of the coefficient K that is over 8.0 will provide no further improvement in the procedure.

The procedure of the present invention can be described in the following four Examples:

EXAMPLE 1

The substrate 11 includes a thick nickel foil (having a 0.1 millimeter thickness, a length of 1000 millimeters, a width of 50 millimeters) and a biaxial melt-textured dielectric intermediate layer. For coating, a high temperature superconducting "HTSL" material with the composition $Yba_2Cu_3O_{7-x}$ is utilized. The substrate 11 is rolled spirally or helically on the pipe 22 and placed with the pipe 22 in the tubular heating zone 2 provided with the surrounding screen 3. During the impact of the laser pulses on the target 5, which has a length L of 160 millimeters and width of 40 millimeters, the pipe 22 rotates around its axle and moves in a linear manner. The target is covered with the laser beam 7 in accordance with the above equation with a calculated frequency F1 of approximately 5 Hertz. The coefficient K is 4.4. The repetition rate of the laser pulses, at 308 nanometers and 20 nanoseconds corresponds to a frequency of F=80 Hertz. During deposition of th e superconductive material in the deposition chamber 1, an oxygen atmosphere of 0.3 millibar is maintained, and additional oxygen is injected into the area of the heating zone 2. The oxygen can be preferably injected in pulses, in particular between the laser pulses. For injecting the oxygen, a discharge opening 23 can be attached in the heating zone 2, which is situated so that it is diametrically opposite opening 9. The coating rate is 115 nanometers×cm²/s. This is a ten-fold increase over known procedures. The critical current density Jc of the separated section corresponds to 7 kA/mm².

EXAMPLES 2 to 4

The parameters of target 5 and coating material are the same as in the preceding Example 1 with only the coefficient K and the repetition rate F of the laser pulses varying in each case. The appropriate values are similar to those found in Example 1 and are indicated in Table 1 below. In Table 1, the respective frequency of oscillation F1, the current density Jc and the coating rate BR are also entered.

TABLE 1

|  | K | F | Fl | Jc | BR |
|---|---|---|---|---|---|
| Example 1 | 4.4 | 180 Hz | 5 Hz | 7 kA/mm² | 115 nm × cm²/s |
| Example 2 | 1.5 | 294 Hz | 2.8 Hz | 5.5 kA/mm² | 180 nm × cm²/s |
| Example 3 | 0.5 | 294 Hz | 0.9 Hz | 3.5 kA/mm² | 185 nm × cm²/s |
| Example 4 | 8,0 | 140 Hz | 7 Hz | 6 kA/mm² | 80 nm × cm²/s |

While preferred embodiments of the present invention have been illustrated and described, this has been by way of illustration and the invention should not be limited except as required by scope of the appended claims.

We claim:

1. A process for applying a superconductive layer on an elongate substrate comprising:
   moving said elongate substrate through a heating zone;
   applying a pulsed laser beam against a target of superconductive material over a length of the target whereby a superconductive material is separated from said target and strike said elongate substrate heated in said heating zone;
   linearly oscillating said pulsed laser beam across said target to linearly scan the surface of the target in a scan direction; and
   rotating said target 180° within its surface plane after at least one laser scan has been completed.

2. The process for applying a superconductive layer on an elongate substrate according to claim 1, wherein said oscillating of said pulsed laser beam across said target includes directing said pulsed laser beam to a laser beam deflector that can reflect said pulsed laser beam across said length of said target.

3. The process for applying a superconductive layer on an elongate substrate according to claim 2, wherein said laser beam deflector includes a pivotable mirror.

4. The process for applying a superconductive layer on an elongate substrate according to claim 3, wherein said pivotable mirror is oscillated back and forth so that said pulsed laser beam covers said length of said target to uniformly apply said superconductive layer on said elongate substrate with said plasma beam.

5. The process for applying a superconductive layer on an elongate substrate according to claim 1, further includes rotating said target at least one hundred and eighty degrees.

6. The process for applying a superconductive layer on an elongate substrate according to claim 5, further includes interrupting said laser beam prior to said rotation of said target at least one hundred and eighty degrees.

7. The process for applying a superconductive layer on an elongate substrate according to claim 1, wherein oscillating said pulsed laser beam across said target to provide a substantially uniform coating of superconductive material on said elongate substrate is at a frequency (F1) represented by the equation:

$$F1 = K \times F/(L/A)$$

where K is a coefficient between the values of 0.5 and 8.0, F is a repetition rate of said pulsed laser beam in cycles per second, L is said length of said target in millimeters over which said pulsed laser beam oscillates and A is a constant that corresponds to 1 millimeter.

8. The process for applying a superconductive layer on an elongate substrate according to claim 5, wherein said target is rotated one hundred and eighty degrees after said pulsed laser beam strikes said length of said target in a range of between one and ten times.

9. The process for applying a superconductive layer on an elongate substrate according to claim 1, wherein said oscillating of said pulsed laser beam across said target corresponds to a saw tooth waveform.

10. The process for applying a superconductive layer on an elongate substrate according to claim 1, wherein said elongate substrate is helically wound around a pipe.

11. The process for applying a superconductive layer on an elongate substrate according to claim 1, further includes rotating said elongate substrate as said elongate substrate moves through said heating zone.

12. The process for applying a superconductive layer on an elongate substrate according to claim 1, wherein said elongate substrate is moved through a heating zone in a linear manner.

13. The process for applying a superconductive layer on an elongate substrate according to claim 1, further includes injecting oxygen into said heating zone.

14. The process for applying a superconductive layer on an elongate substrate according to claim 13, wherein said injecting of oxygen into said eating zone is pulsed.

15. The process for applying a superconductive layer on an elongate substrate according to claim 1, further includes injecting oxygen into said heating one between pulses of said laser beam.

16. The process for applying a superconductive layer on an elongate substrate according to claim 1, wherein said heating zone is in a deposition chamber, and further including injecting oxygen into said heating zone through a second opening in said deposition chamber that is diametrically opposite a first opening in said deposition chamber that receives said plasma beam from said target.

17. An apparatus for applying a superconductive layer on an elongate substrate comprising:

a deposition chamber having a heating zone through which the elongate substrate can be moved;

a laser that can apply a pulsed laser beam;

a target formed from a superconductive material and having a length;

an oscillating mechanism to move said pulsed laser beam across said target in a scan direction whereby said superconductive material is separated from said target and strike said elongate substrate heated in said heating zone;

a rotation mechanism for rotating said target by 180° within its surface plane; and a control unit for controlling the sequential movement of the laser beam and rotation of the target.

18. The apparatus for applying a superconductive layer on an elongate substrate according to claim 17, wherein said oscillating mechanism includes a laser beam deflector that can reflect said pulsed laser beam across said length of said target.

19. The apparatus for applying a superconductive layer on an elongate substrate according to claim 18, wherein said laser beam deflector includes a pivotable mirror.

20. The apparatus for applying a superconductive layer on an elongate substrate according to claim 19, wherein said oscillating mechanism further includes mechanism to oscillate said pivotable mirror back and forth so that said pulsed laser beam covers said length of said target.

21. The apparatus for applying a superconductive layer on an elongate substrate according to claim 17, wherein said oscillating mechanism moves said pulsed laser beam across said target in correspondence with a saw tooth waveform.

22. The apparatus for applying a superconductive layer on an elongate substrate according to claim 17, further includes a mechanism that rotates said elongate substrate as said elongate substrate moves through said deposition chamber.

23. The apparatus for applying a superconductive layer on an elongate substrate according to claim 17, further includes a mechanism that moves said elongate substrate linearly through said deposition chamber.

24. The apparatus for applying a superconductive layer on an elongate substrate according to claim 1, further a mechanism that injects oxygen into said deposition chamber.

25. The apparatus for applying a superconductive layer on an elongate substrate according to claim 24, wherein said mechanism that injects oxygen into said deposition chamber injects said oxygen in pulses.

26. The apparatus for applying a superconductive layer on an elongate substrate according to claim 24, wherein said mechanism that injects oxygen into said deposition chamber injects said oxygen between pulses of said laser beam.

27. The apparatus for applying a superconductive layer on an elongate substrate according to claim 24, wherein said mechanism that injects oxygen into said deposition chamber, injects said oxygen through a second opening in said deposition chamber that is diametrically opposite a first opening in said deposition chamber that receives said plasma beam from said target.

28. The process according to claim 1 wherein the target is moved perpendicularly to said scan direction.

29. The process according to the claim 28 wherein said moving of the target perpendicularly to said scan direction is performed after at least one linear scan has been completed.

30. The process according to claim 1 wherein the target and the substrate are arranged in parallel.

31. The apparatus according to claim 17 wherein the target is shiftable periodically in a direction perpendicular to said scan direction.

32. The apparatus according to claim 17 wherein the target and the substrate are arranged in parallel.

* * * * *

UNITED STATES PATENT AND TRADEMARK OFFICE
CERTIFICATE OF CORRECTION

PATENT NO. : 6,506,439 B1
DATED : January 14, 2003
INVENTOR(S) : Alexander Usoskin, Herbert Carl Freyhardt and Juergen Knoke It is certified that error appears in the above-identified patent and that said Letters Patent is hereby corrected as shown below:

Column 1,
Line 18, delete "$Nb_{3sn}$" and insert -- $Nb_3Sn$ --

Column 3,
Line 12, delete "milibars" and insert -- millibars --

Column 5,
Line 10, following "target" insert -- 5 --
Line 14, delete "F=80" and insert -- F=180 --
Line 15, delete "th e" and insert -- the --
Line 23, delete "nanometersxcm2/s" and insert -- nanometers x $cm^2$/s --

Column 6,
Line 57, delete "one" and insert -- zone --

Signed and Sealed this

Twenty-second Day of July, 2003

JAMES E. ROGAN
*Director of the United States Patent and Trademark Office*